US012731067B2

(12) United States Patent
Mehendale et al.

(10) Patent No.: US 12,731,067 B2
(45) Date of Patent: Sep. 8, 2026

(54) MACHINE LEARNING HARDWARE ACCELERATOR

(71) Applicant: TEXAS INSTRUMENTS INCORPORATED, Dallas, TX (US)

(72) Inventors: Mahesh Madhukar Mehendale, Dallas, TX (US); Vinod Joseph Menezes, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 630 days.

(21) Appl. No.: 17/060,827

(22) Filed: Oct. 1, 2020

(65) Prior Publication Data

US 2022/0108203 A1 Apr. 7, 2022

(51) Int. Cl.
*G06N 20/00* (2019.01)
*G06F 7/501* (2006.01)
*G11C 11/412* (2006.01)

(52) U.S. Cl.
CPC ............. *G06N 20/00* (2019.01); *G06F 7/501* (2013.01); *G11C 11/412* (2013.01)

(58) Field of Classification Search
CPC ........ G06N 20/00; G06F 7/501; G11C 11/412
See application file for complete search history.

(56) References Cited

U.S. PATENT DOCUMENTS 9,734,896 B2 8/2017 Roine et al.
11,182,666 B1 * 11/2021 Phebus .................. G06N 3/048
2002/0105826 A1 * 8/2002 Yamauchi .............. H10B 10/12 257/E27.099
2006/0187702 A1 * 8/2006 Jacquet .................... G11C 7/02 365/154
2008/0144413 A1 * 6/2008 Barasinski ............ G11C 11/419 365/203
2008/0243462 A1 * 10/2008 Guenther .............. G06F 30/331 703/15
2016/0054995 A1 2/2016 Dehner
2019/0080231 A1 * 3/2019 Nestler ................ G11C 7/1006
2019/0385005 A1 * 12/2019 Yang ...................... G06V 10/25
2020/0034148 A1 * 1/2020 Sumbul .................. G06N 3/063
2023/0367514 A1 * 11/2023 Wang .................... G06F 3/0655

FOREIGN PATENT DOCUMENTS

CN 109785882 B 5/2019

OTHER PUBLICATIONS

White, Stanley A. "Applications of Distributed Arithmetic to Digital Signal Processing: A Tutorial Review." IEEE ASSP Magazine, Jul. 1989, pp. 4-18.
First Office Action and Search Report in corresponding China App. No. 202111149473.4, issued Mar. 30, 2026, 19 pgs.

* cited by examiner

*Primary Examiner* — Baboucarr Faal
(74) *Attorney, Agent, or Firm* — Zhenhai Fu; Frank D. Cimino

(57) ABSTRACT

In a memory device, a static random access memory (SRAM) circuit includes an array of SRAM cells arranged in rows and columns and configured to store data. The SRAM array is configured to: store a first set of information for a machine learning (ML) process in a lookup table in the SRAM array; and consecutively access, from the lookup table, information from a selected set of the SRAM cells along a row of the SRAM cells. A memory controller circuit is configured to select the set of the SRAM cells based on a second set of information for the ML process.

26 Claims, 10 Drawing Sheets

100
102A
102B
102C
102D
A[0].X[0][0] +A[0].X[0][1].2^1 +A[0].X[0][2].2^2 + ... +A[0].X[0][K-1].2^(K-1) +
A[1].X[1][0] +A[1].X[1][1].2^1 +A[1].X[1][2].2^2 + ... +A[1].X[1][K-1].2^(K-1) +
A[2].X[2][0] +A[2].X[2][1].2^1 +A[2].X[2][2].2^2 + ... +A[2].X[2][K-1].2^(K-1) +
A[3].X[3][0] +A[3].X[3][1].2^1 +A[3].X[3][2].2^2 + ... +A[3].X[3][K-1].2^(K-1) +

200
K BIT DATA
X[0].K-1
X[0].0
X[1].K-1
X[1].0
X[2].K-1
X[2].0
X[3].K-1
X[3].0
ADDRESS GEN
202
X[0][i] X[1][i] X[2][i] X[3][i] Y
0 0 0 0 0
0 0 0 1 A[3]
0 0 1 0 A[2]
0 0 1 1 A[2]+A[3]
0 1 0 0 A[1]
0 1 0 1 A[1]+A[3]
0 1 1 0 A[1]+A[2]
0 1 1 1 A[1]+A[2]+A[3]
1 0 0 0 A[0]
1 0 0 1 A[0]+A[3]
1 0 1 0 A[0]+A[2]
1 0 1 1 A[0]+A[2]+A[3]
1 1 0 0 A[0]+A[1]
1 1 0 1 A[0]+A[1]+A[3]
1 1 1 0 A[0]+A[1]+A[2]
1 1 1 1 A[0]+A[1]+A[2]+A[3]
SIGN CONTROL
+/-
208
ACCUMULATOR
204
>>1
206

MACHINE LEARNING HARDWARE ACCELERATOR

BACKGROUND

Machine learning (ML) is a type of artificial intelligence (AI) that helps a software system learn to recognize patterns from data without being directly programmed to do so. Machine learning can refer to a wide range of techniques. Examples of ML techniques include neural networks and deep learning. Broadly, ML techniques operate in two phases, which are: (a) a training phase, in which models and/or weights are adjusted based on received training data; and (b) an operating phase, in which those models and/or weights are applied to received actual data.

ML techniques are useful in smart systems to detect or recognize various aspects of the environment. Examples of such detection or recognition scenarios include speech recognition, object recognition in video and/or images, gesture and motion recognition, sound signature detection, anomaly detection, and the like. Machine learning techniques may consume large amounts of processing, data and power resources. These requirements impose challenges that interfere with executing complex ML techniques on a portable, battery-operated and/or low-powered device. To address those challenges, one workaround offloads processing of some or all ML operations to a remote network (such as a cloud) and returns the results of those offloaded ML operations to the device. However, that workaround may send irrelevant information to the cloud for processing. For example, an "always on" device may constantly listen for specific commands or keywords, capture a substantial amount of irrelevant audio, and upload the irrelevant audio to the cloud for processing, which results in wasted bandwidth, processing power and potential privacy issues.

SUMMARY

In a memory device, a static random access memory (SRAM) circuit includes an array of SRAM cells arranged in rows and columns and configured to store data. The SRAM array is configured to: store a first set of information for a machine learning (ML) process in a lookup table in the SRAM array; and consecutively access, from the lookup table, information from a selected set of the SRAM cells along a row of the SRAM cells. A memory controller circuit is configured to select the set of the SRAM cells based on a second set of information for the ML process.

In another aspect, a system includes one or more microprocessors coupled to a memory circuit. The memory circuit includes static random access memory (SRAM) circuit including an array of SRAM cells arranged in rows and columns and configured to store data, the SRAM array configured to: store a first set of information for a machine learning (ML) process in a lookup table in the SRAM array; and consecutively access, from the lookup table, information from a selected set of the SRAM cells along a row of the SRAM cells. A memory controller circuit is configured to select the set of the SRAM cells based on a second set of information for the ML process.

In another aspect, a method includes receiving a first set of information for a machine learning (ML) process; storing the first set of information in a lookup table in an array of SRAM cells, the SRAM cells arranged in rows and columns; selecting a set of the SRAM cells based on a second set of information for the ML process; and consecutively accessing, from the lookup table, information from the selected set of the SRAM cells along a row of the SRAM cells.

DETAILED DESCRIPTION

To increase efficiency in devices, special-purpose hardware executes a specific operation along with or instead of more general-purpose hardware. One example is a graphics processing unit (GPU) along with a central processing unit (CPU). In aspects of this description, an ML hardware accelerator based on distributed arithmetic (DA) and near memory computing may improve efficiency of operating ML networks.

Figures 1, 2A:
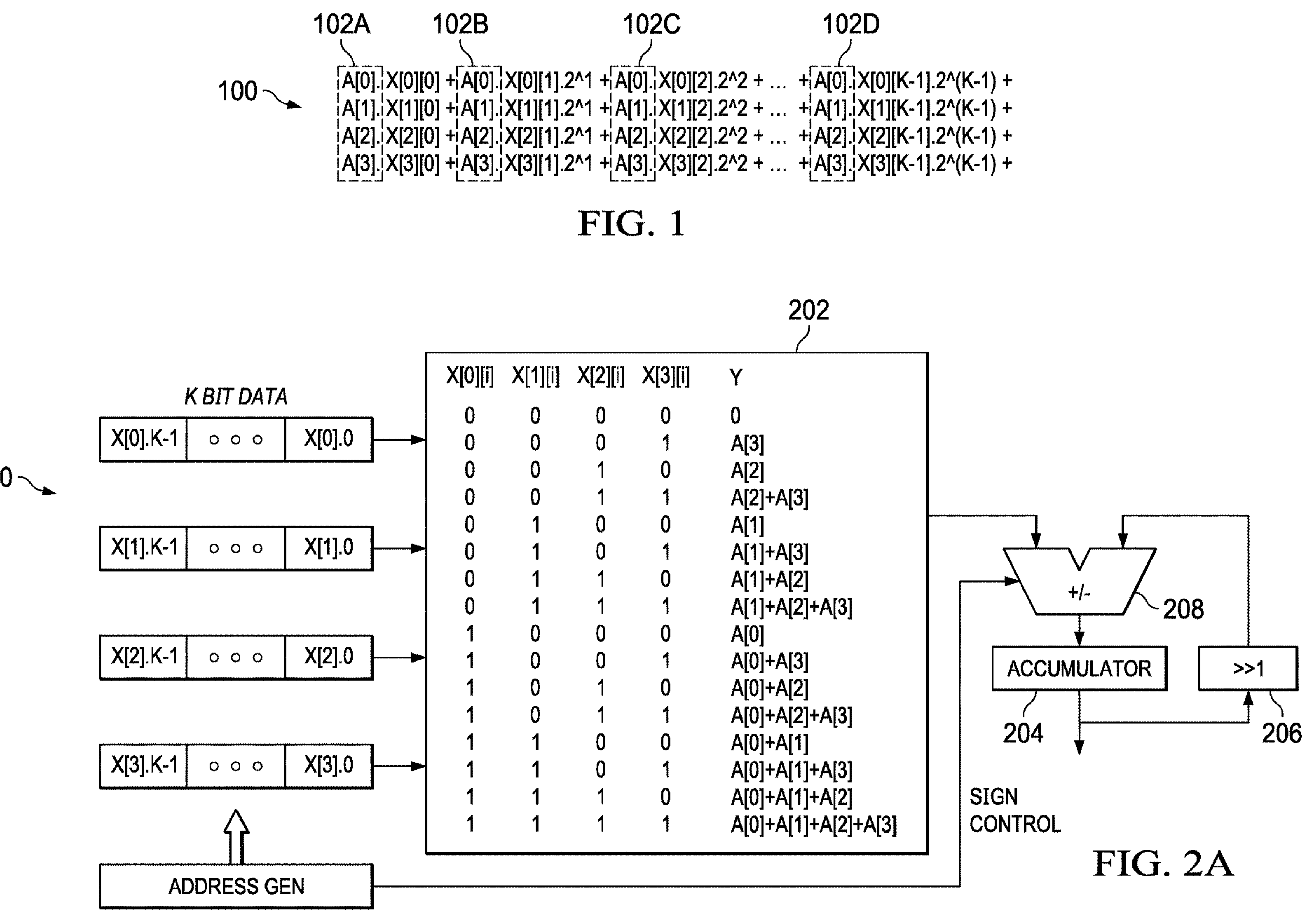
FIG. 1 illustrates an example distributed arithmetic (DA) computation, in aspects of this description.
FIGS. 2A, 2B, and 2C are block diagrams of DA circuits, in aspects of this description.

FIG. 1 illustrates an example DA computation 100, in aspects of this description. Distributed arithmetic is a technique for solving multiply and accumulate operations efficiently, by using add and shift operations instead of hardware multipliers. DA computation may be, but is not necessarily, a bit serial operation that forms a dot product of a pair of vectors in a single step by precomputing certain frequently used values and storing these values in a lookup table (LUT) as they are needed. For example, an equation of the form $$Y = \sum_{n=0}^{N} A_n X_n$$

(where $A_n$ are fixed coefficients, $X_n$ is received data, and n is a number of summations) may be expanded in the form of Y=A[0]X[0]+A[1]X[1] . . . A[N]X[N]. Where the received data X is K bits long (e.g., 8-bit, 16-bit, etc.), and where X[0][0] represents the least significant bit (LSB) [0] of X[0], the equation may be expanded as shown in FIG. 1. In this example, each X is a single binary bit, which is either a logical 0 or a logical 1. Instead of performing the computation by multiplying A[0] with X[0][0] and A[0] with $X[0][1]*2^1$, and adding those results of the multiplication step, the DA computation effectively considers the equations vertically. Accordingly, in this example, the DA computation maps possible values (such as sixteen possible values in this example) of X[n][i] to linear combinations of A[0], A[1], A[2], and A[3], as shown in 102A-102D of FIG. 1, in a LUT, and as shown below in Table 1.

TABLE 1

| x[0][i] | x[1][i] | X[2][i] | X[3][i] | Y |
|---|---|---|---|---|
| 0 | 0 | 0 | 0 | 0 |
| 0 | 0 | 0 | 1 | A[3] |
| 0 | 0 | 1 | 0 | A[2] |
| 0 | 0 | 1 | 1 | A[2] + A[3] |
| 0 | 1 | 0 | 0 | A[1] |
| 0 | 1 | 0 | 1 | A[1] + A[3] |
| 0 | 1 | 1 | 0 | A[1] + A[2] |
| 0 | 1 | 1 | 1 | A[1] + A[2] + A[3] |
| 1 | 0 | 0 | 0 | A[0] |
| 1 | 0 | 0 | 1 | A[0] + A[3] |
| 1 | 0 | 1 | 0 | A[0] + A[2] |
| 1 | 0 | 1 | 1 | A[0] + A[2] + A[3] |
| 1 | 1 | 0 | 0 | A[0] + A[1] |
| 1 | 1 | 0 | 1 | A[0] + A[1] + A[3] |
| 1 | 1 | 1 | 0 | A[0] + A[1] + A[2] |
| 1 | 1 | 1 | 1 | A[0] + A[1] + A[2] + A[3] |

Accordingly, a circuit 200 (FIG. 2A) may solve for an equation using DA by mapping the values for the X[N][i] bit being processed to the LUT to the appropriate Y value. For example, for the i=1 bit, where X[0][1] is 0, X[1][1] is 1, X[2][1] is 0, and X[3][1] is 1, the Y value is A[1]+A[3]. The value of A[1]+A[3] is read from the LUT 202 and placed in the accumulator 204. The next value for X, where i=2, is read from the LUT and effectively multiplied with the contents of the accumulator 204 by performing either a left shift or a right shift of the value from the LUT.

Accordingly, one example performs a right shift 206 of the contents of the accumulator 204, and then adds (via an adder 208) the result to the contents of accumulator 204. This process is repeated for all K bits of the received data to determine a solution for the equation. Generally, solving using DA increases a number of addition operations as compared to conventional techniques for solving such equations, but without complex multiplications. This helps the DA computation to be more efficient than conventional techniques, because the LUT lookup, bit shift and addition steps consume smaller amounts of processing, data and power resources as compared to complex multiplication operations of conventional techniques. Using DA computation, an alternative way to evaluate the weighted-sum is populating the LUTs using X[i]'s and using A[i]'s to address the LUTs.

Figure 2B:
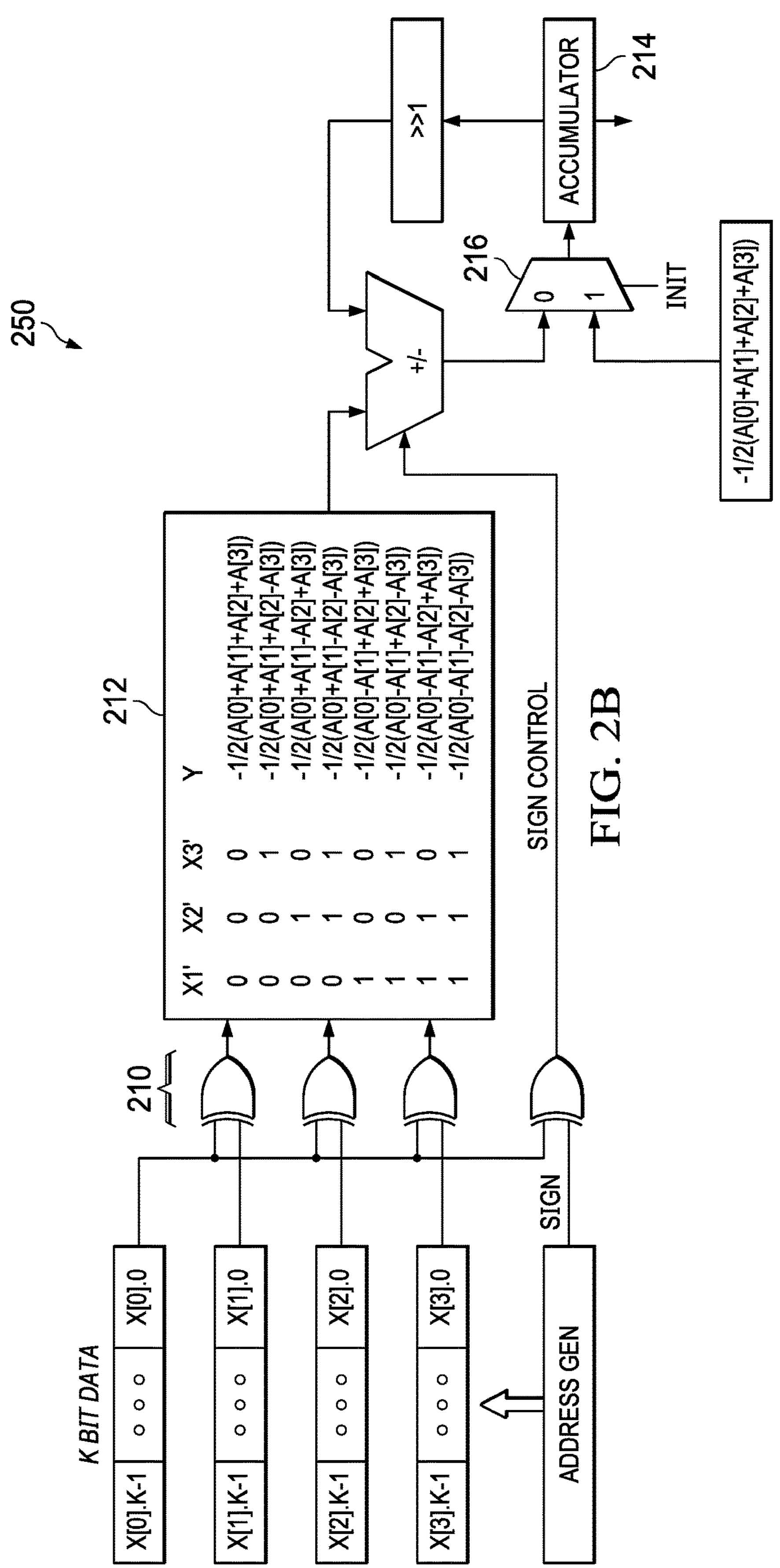

In certain cases, a size of the LUT may be reduced, such as by using multiple smaller LUTs or offset binary coding. FIG. 2B illustrates an example DA circuit 250 using offset binary coding. In this example of offset binary coding, received bit values are provided through a set of exclusive or (XOR) gate 210 to generate a symmetric LUT 212 by effectively replacing one X value, such as X[0][i], from the LUT 212 with the XOR gates 210. The value of the replaced X value changes the sign of the lookup value, and the lookup value can be added or subtracted from the accumulator 214 value based on the value of X[0] based on the sign. In certain cases, the accumulator may be initialized to the first value of the LUT, such as −½(A[0]+A[1]+A[2]+A[3]], or 0,0,0, based on an initialization signal provided by INIT to mux 216.

Figure 2C:
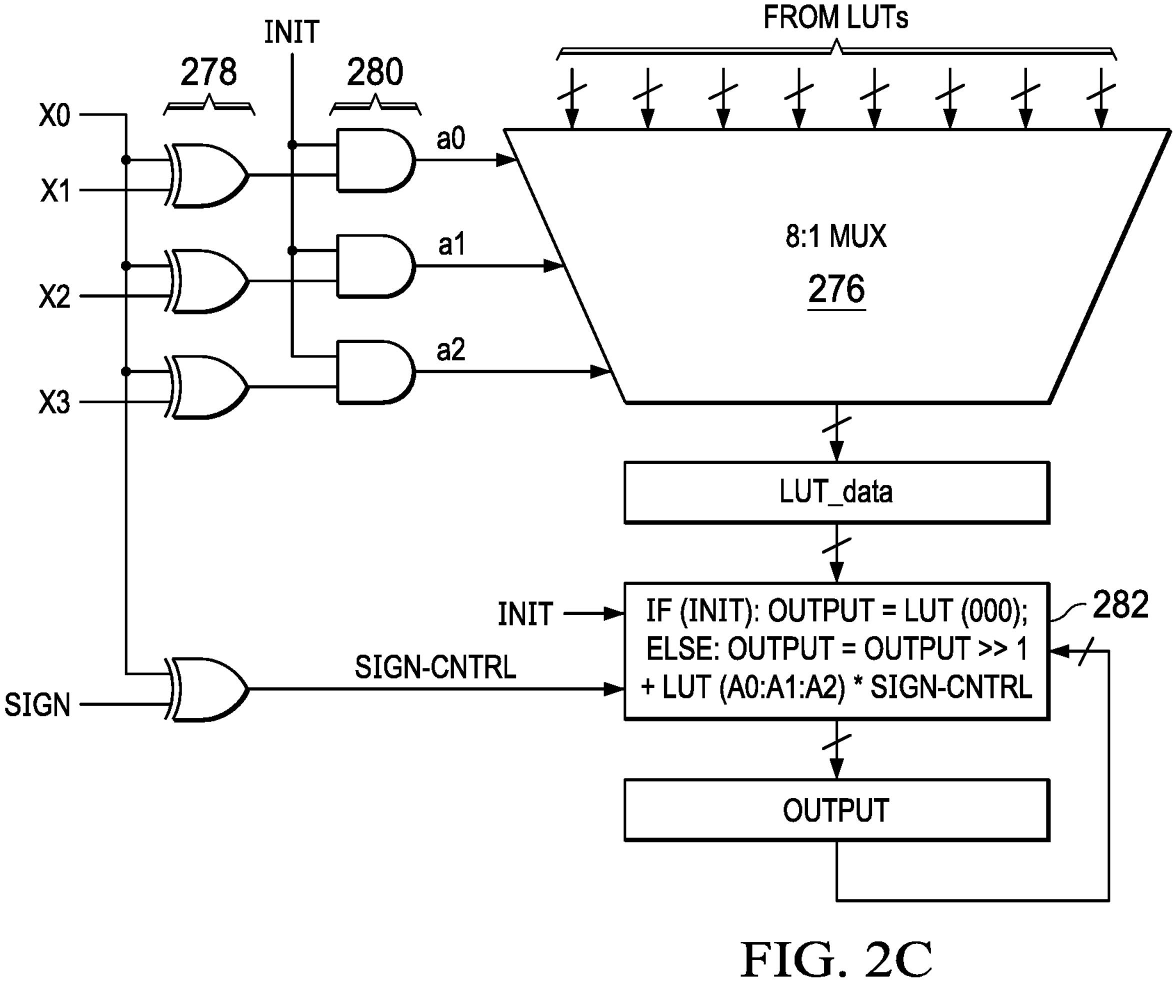

As a more detailed example, LUT 212 may be coupled to a multiplexer (mux) 276, as shown in another example DA circuit 275 of FIG. 2C. A received value indicates which address from the LUT may be provided at X0-X3 to XOR gate 278. In certain cases, XOR gate 278 may correspond to XOR gate 210 of FIG. 2B. The address from the LUT to be accessed is provided to mux 276, and the value at the addressed part of the LUT may then be provided. In certain cases, the accumulator may be initialized, such as at the beginning of a computation, with a value, such as the value of the LUT at the first address, such as 000. In such cases, an initialization signal may be provided by INIT. A set of AND gates 280 ensures the address provided to mux 276 corresponds with the first address, such as 000. The initialization signal may also indicate to accumulator 282 not to perform a right shift of the output from the LUT. In certain cases, DA techniques may be adapted to execute ML techniques.

Figure 3:
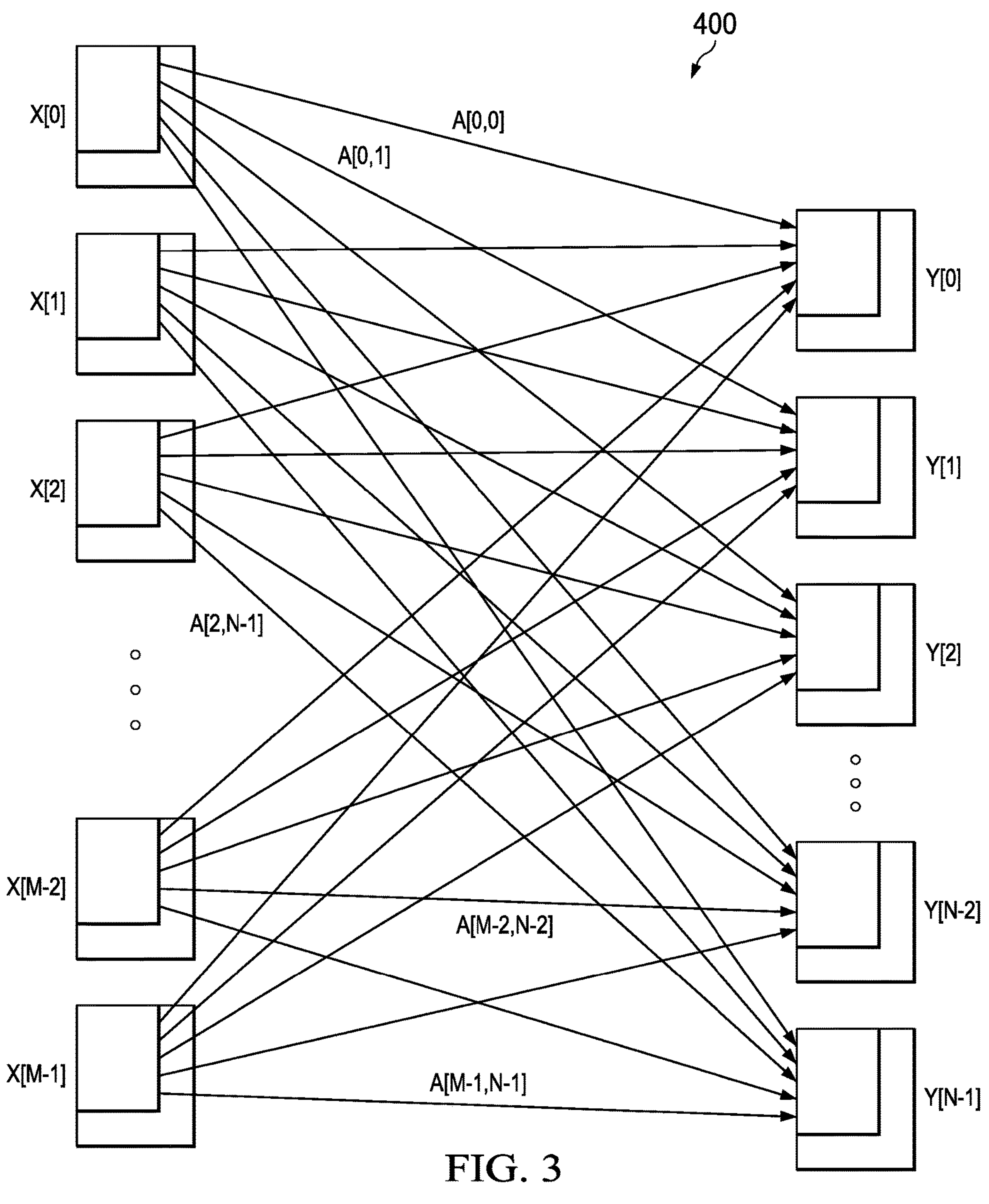
FIG. 3 illustrates example layers of an ML network, in aspects of this description.

FIG. 3 illustrates example layers of an ML network 300. Generally, processing received data through an ML network can be described as a dot product of two vectors, which are: an input vector; and weight vector. This example ML network 300 includes one layer having input and output feature maps as a 1×1 convolutional layer. This example addresses a single layer, but the ML network may include multiple layers. The layers represent a set of convolution operations, which may include a set of matrix multiplications. Generally, each layer transforms M number of input feature maps (X) of dimension W*H to N number of output feature maps Y. A convolutional operation includes a kernel operation (Kw*Kh) which is repeated H*W times. In this example, as there is a single layer, Kw and Kh=1. The first layer X[M] is linked to the second layer with a set of connections, which represents a set of weights that are applied to the received data by the first layer to generate an output that is provided to the second layer. These weights are usually defined during a training phase and may vary according to a position of a given input in the input vector to the X layer, and to the position in the Y layer to which the output of the X layer corresponds. For example, the input for X[m], destined for Y[n], may be multiplied by a certain weight A[m, n], and each input into Y[n] may be then summed to determine a value for Y[n]. One or more LUTs may then be determined for Y as a function of weight A for the X layer, and these calculations for the ML network 300 may be performed using DA as described above.

Generally, the speed and simplicity of static random access memory (SRAM) have allowed SRAM to be fabricated in a single integrated circuit that includes a microprocessor, such as for a near processor cache. In aspects of this description, a burst SRAM may be modified to help accelerate processing for ML networks based operations. Burst SRAM is further described in detail in conjunction with U.S. Pat. No. 9,734,896, which is hereby incorporated by reference. Generally, in conventional SRAM (such as with a mux-factor of eight), for each read cycle, eight bit lines may be precharged, but only a single column is read based on a column decoder address. After the value is read, the lines are precharged/recharged again prior to reading out another value. In contrast, burst SRAM allows multiple memory values to be provided, or burst, from SRAM at a rate of one output per cycle, without required additional time and/or power for bit line precharging/recharging.

Figure 4:
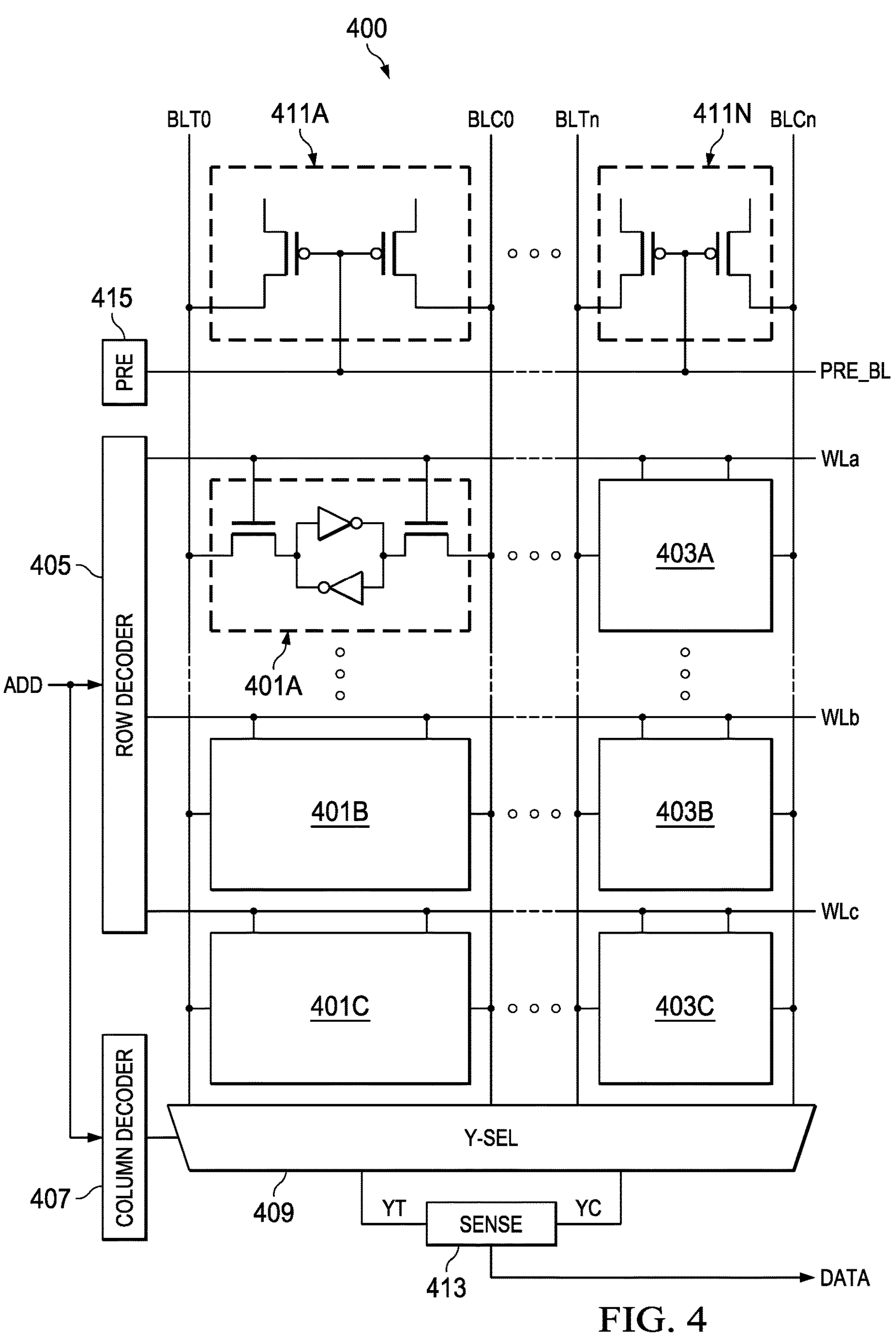
FIG. 4 illustrates an example SRAM memory circuit, in aspects of this description.

FIG. 4 illustrates an example SRAM memory circuit 400. FIG. 4 illustrates a representative implementation of a SRAM memory circuit 400, but other implementations are possible. In FIG. 4, an array of SRAM cells 401A-401C are arranged in a first column, and cells 403A-403C are arranged in a second column. These cells are arranged in rows A-C with word lines WLa-WLc connecting the cells to a row decoder 405. An actual production SRAM device may include thousands or tens of thousands of SRAM cells (or more). The word lines WLa-WLc are provided by the row decoder 405. A column decoder 407 has control lines coupled to a Y-select multiplexer 409, which has inputs that receive bit line pairs BLT0, BLC0 to BLTn, BLCn, and which has a pair of complementary outputs YT, YC coupled to a sense amplifier 413. The sense amplifier 413 latches the differential voltage on the selected bit line pair and provides the signal DATA. The true and complement bit line pairs BLT0, BLC0 to BLTn, BLCn, are respectively coupled to precharge circuits 411A-411N. A precharge control circuit 415 provides the precharge control signal PRE_BL to the precharge circuits.

In operation, the SRAM memory circuit 400 memory access cycle begins when a clock signal CLK goes high. The input address ADD is latched, and row decoder 405 begins decoding a portion of the address field and provides a high voltage on a selected one of the word lines WLa-WLc, selected by a portion of the address. The column decoder 407 begins by decoding a second portion of the address field ADD and provides a select signal to the Y-select multiplexer 409. The Y-select multiplexer determines which ones of the bit line pairs BLT0, BLC0-BLTn, BLCn is selected.

When the word line voltage on the selected word line WLa-WLc rises, the complementary bit lines for the SRAM cells along the selected row are coupled to the storage nodes within each of the SRAM cells. The voltages on the complementary bit line pairs in each column begin to spread apart as the differential voltage in the SRAM cells is shared with the bit lines. Each bit line along the active row will transition to the differential voltage value of the storage nodes of the SRAM cells in the corresponding columns.

The column select multiplexer 409 then couples the selected bit line pair to the complementary output signals YT and YC. Column decoder 407 determines which column is selected, based on a column portion of the input address ADD. Sense amplifier 413 then receives the differential voltage signal, senses the differential voltage, latches and amplifies it, and provides the data from the selected SRAM cell as the output data signal DATA.

As described above, the memory access cycle includes several steps performed within the SRAM memory circuit 400 during each clock cycle. In certain cases, multiple sequential (e.g., consecutive, or back-to-back) SRAM reads of SRAM cells arranged along a particular row may be performed. Before the first SRAM cell access to a newly addressed row (or, for a first SRAM access after a power up, reset, or wake up operation), a precharge operation precharges all the complementary bit line pairs in the SRAM array. The selected row line is determined for the first SRAM cell for consecutive access, and the row decoder asserts the selected word line, such as WLa. When the word line voltage is raised above a transistor threshold voltage for the SRAM cells along a particular row in the SRAM array, the complementary bit line pairs coupled to the SRAM cells each receive a differential voltage corresponding to the stored data within each of the SRAM cells along the selected row line. The column decoder simultaneously decodes the column portion of the address field and controls the Y-select multiplexer to select the column for the read operation. A sensing operation is then performed by the sense amplifier 413, and the first read data becomes available as the sense amplifier 413 provides the latched sense data.

After the first SRAM memory cell access, the second SRAM cell is accessed by selecting the next addressed column (which is on the same row in the SRAM array, and which is optionally adjacent to the column of the previously accessed SRAM cell), in the consecutive access. The corresponding bit line pair for this column is then coupled to the sense amplifier 413 (or another sense amplifier), the differential voltage is sensed, and the data from this SRAM cell is provided. The SRAM array may be configured with any number of columns and one or more corresponding multiplexers and sense amplifiers. In certain cases, the SRAM array may include eight columns of cells, and the Y-select multiplexer may likewise be configured to perform eight reads from the cells in a row. LUT values may be stored in the SRAM array, so eight columns of the SRAM array correspond to values of in eight-bit wide LUT. Consecutive accesses to the LUT may then be performed by accessing multiple, back-to-back accesses from the cells in a row. The consecutive access is performed for a given row, but the specific order in which the columns of the given row may be any order. For example, in an eight entry lookup table, the ML process can make eight back-to-back accesses, but these could be entry numbers 1, 5, 3, 2, 5, 6, 4, 7 from the LUT.

Storing the LUT in the burst SRAM thus allows multiple LUT values (stored in the LUT) to be read from the SRAM, one at a time. As described above, DA-based computations include K lookups in the LUT for values corresponding to each bit of the received data. However, these lookups may not be consecutive, because the looked-up value depends on the received bit value. Instead, the received bit value drives the Y-select multiplexer, so the appropriate LUT value is returned for the received bit value.

Figure 5:
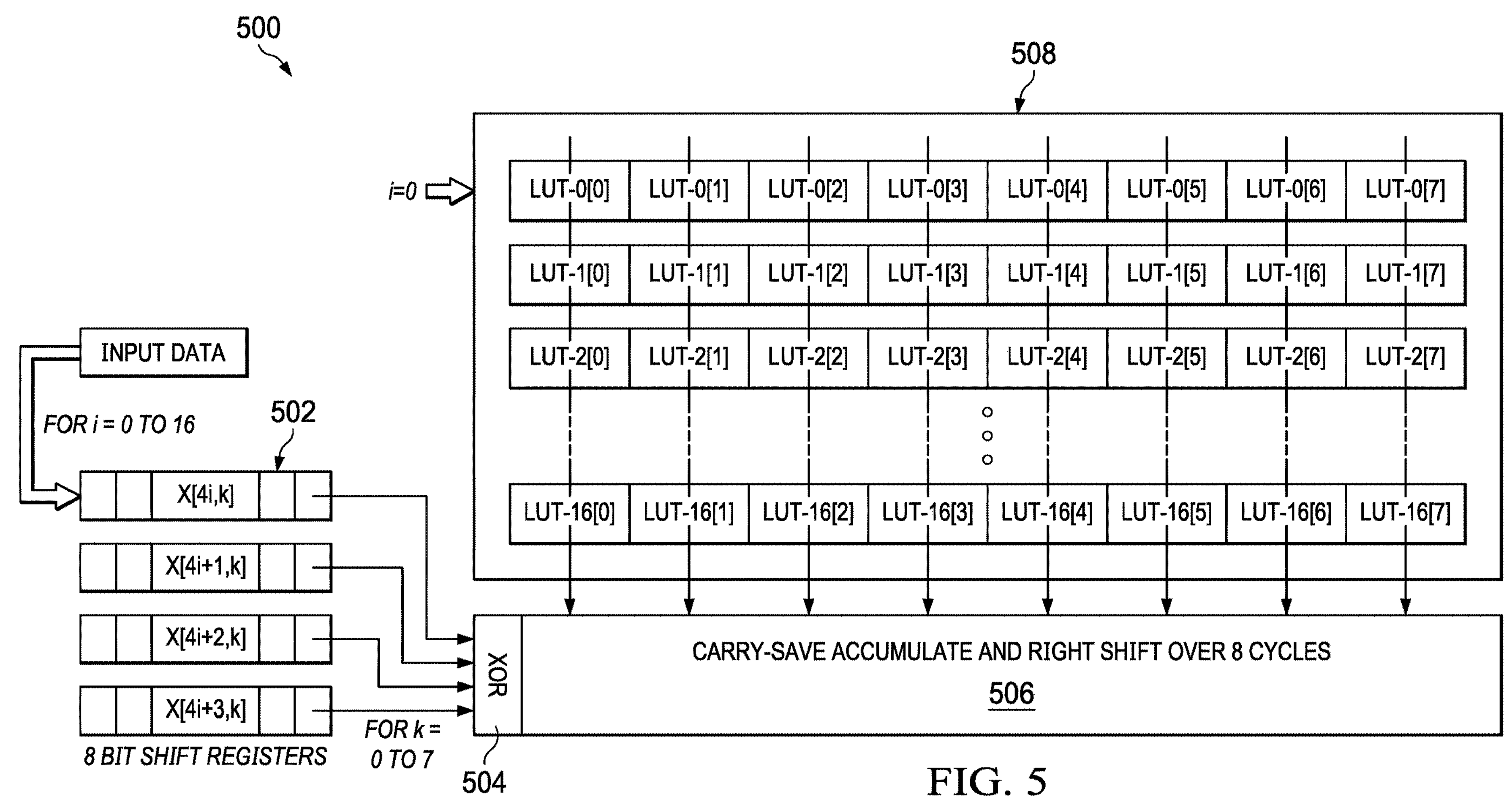
FIG. 5 illustrates an example operation of the convolutional layer, in aspects of this description.

FIG. 5 illustrates an example operation of the convolutional layer 500. In certain cases, operation 500 may be implemented in conjunction with a LUT and accumulator. In operation 500, received values may be stored in a bit shift registers 502. These bit shift registers 502 are coupled to a switch circuit, such as chain of XOR gates 504, which are further described in conjunction with FIG. 6. Bits i of the received value are provided each cycle to the switch, and each bit selects the appropriate column via the column decoder and Y-select multiplexer to read values of the LUT stored in the SRAM cells 508. The output of LUT may then be provided to an accumulator circuit 506. This helps allow the SRAM to burst out the appropriate LUT values based on the received bits.

For example, in a single output computation (e.g., convolution) with 64 inputs Y=A0.X0+A1.X1+A2.X2++ A63.X63, sixteen 8-entry LUTs may be constructed of groups of four weights (A0-A3, A4-A7, A8-A11, . . . , A60-A63). An output register of the accumulator circuit 506 may be initialized to all zeros. For each of the 16 LUTs, received bits are loaded in groups of 4 (X[4i], X[4i+1], X[4i+2], X[4i+3], for i=0 to 15), into address registers. The output register may be initialized based on the first address in the LUT (0,0,0). Then, once per set of entries in the LUT (e.g., eight times in this example), the operations include right shifting address registers by 1 to get a next address bit (X0, X1, X2, X3), performing an XOR operation to obtain the LUT address bits (a0, a1, a2) and a sign control signal, reading the contents of the LUT [i][a0:a1:a2], and conditionally summing (e.g., adding or subtracting) to the right shifted accumulator. In certain cases, the accumulator circuit 506 includes logic configured to perform an appropriate bit shift and addition logic, as described in conjunction with FIGS. 2A and 2B and further described in conjunction with FIG. 6.

Figure 6:
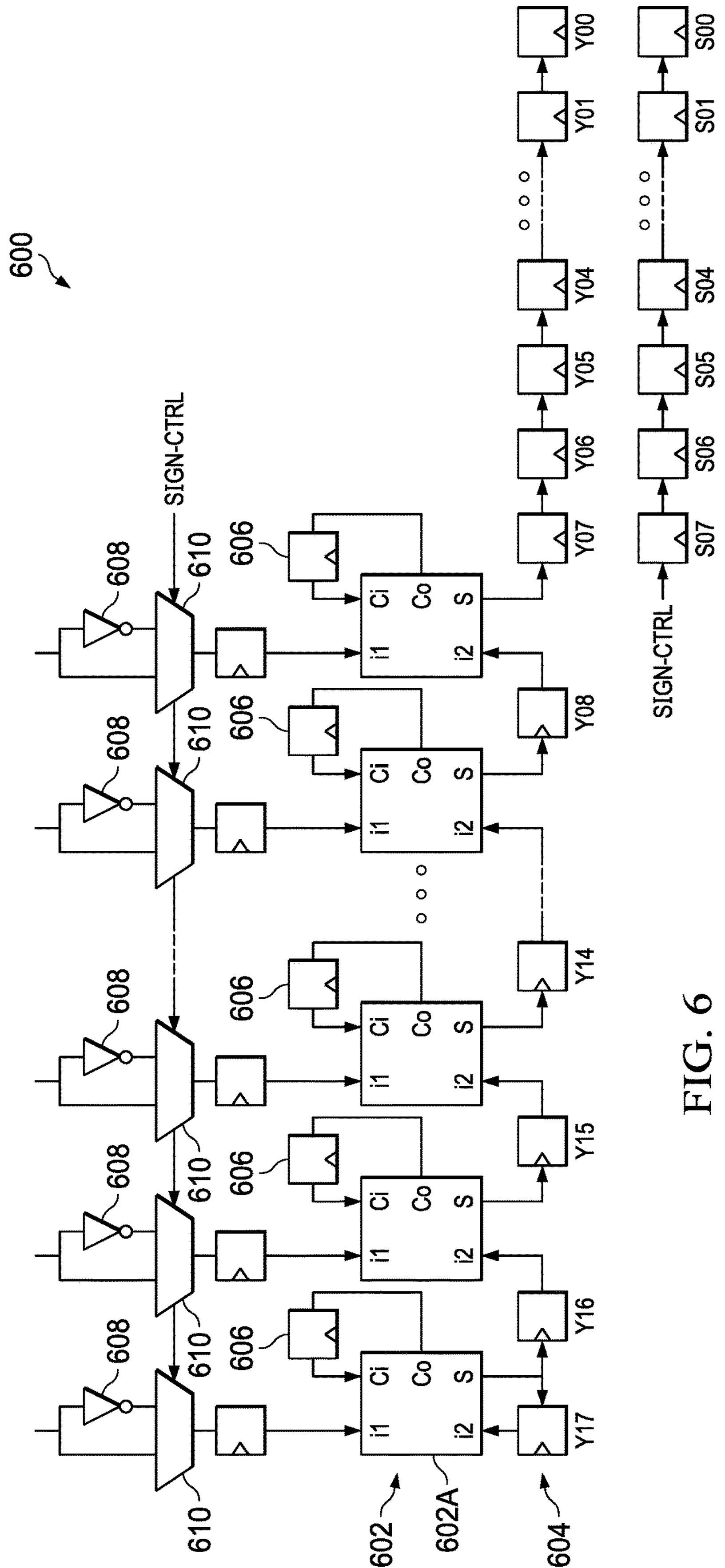
FIG. 6 illustrates an example accumulator circuit with carry save adders and shifters, in aspects of this description.

FIG. 6 illustrates an example accumulator circuit 600 with carry save adders and shifters. The accumulator circuit 600 receives a bit per clock cycle, which may be added to any previously received bits to accumulate a result in the bit registers over multiple clock cycles. The accumulator circuit 600 includes an XOR circuit 608 and a set of 1-bit full adders 602 and register bits 604. Each adder can receive: bits at i1 and i2; and a carry-in signal at Ci. Also, each adder can provide: a carry-out signal at Co; and a sum at S. A number of adders may be based on an expected number of received bits. Accordingly, for example, if 16 bits of received data are expected, then the accumulator circuit 600 may include 16 adders. The adders may be configured to couple the carry-out output lines to the carry-in input lines. For a first value of n bits [n . . . 0], each bit of the first value may be received at of the respective adder 602 of the bit, and a sum may be output at S into registers Y16 through Y07 in a first clock cycle. This output sum is provided to i2 of the adders 602 for a second value. The second value of n bits [n . . . 0] may then be received at i1 of the respective adder 602 and added with the value at i2 in a second clock cycle. If a carry is needed, then an appropriate value is provided at Co and stored in a carry register 606 for use as a carry signal Ci for the next value. The value in register Y07 may be shifted into register Y06, and any value in register Y06 may be shifted into register Y05 and so forth. A value is recorded in the sign control register 610, indicating whether the operation was an addition or subtraction. This pattern is repeated for each received value, such as for the values in the LUT, and the output value of the summation is available in registers Y00-Y07. If a subtraction is needed for a value, then a sign control signal may provided to multiplexers 610, thereby causing multiplexers 610 to invert their input by performing a ones complement operation for subtraction. To complete the subtraction operation, a twos complement operation is performed by setting a value in a sign control register 612 that includes bits S07-S00, recording the subtraction operation. After each received value is summed, values in the sign control registers S07-S00 are added to the registers to obtain a final result. The output from the SRAM, such as SRAM cells 508, may be provided to the accumulator circuit 600 as they are burst out over K cycles. This one bit at a time addition helps reduce the amount of time required (instead of reading out the entire burst, performing a K bit addition, and a left shift). Also, this structure of adders 602 takes advantage of how the SRAM bursts data out, so the structure of adders may be placed very near the SRAM (on the same integrated circuit) and processed before sending to a CPU.

Figure 7:
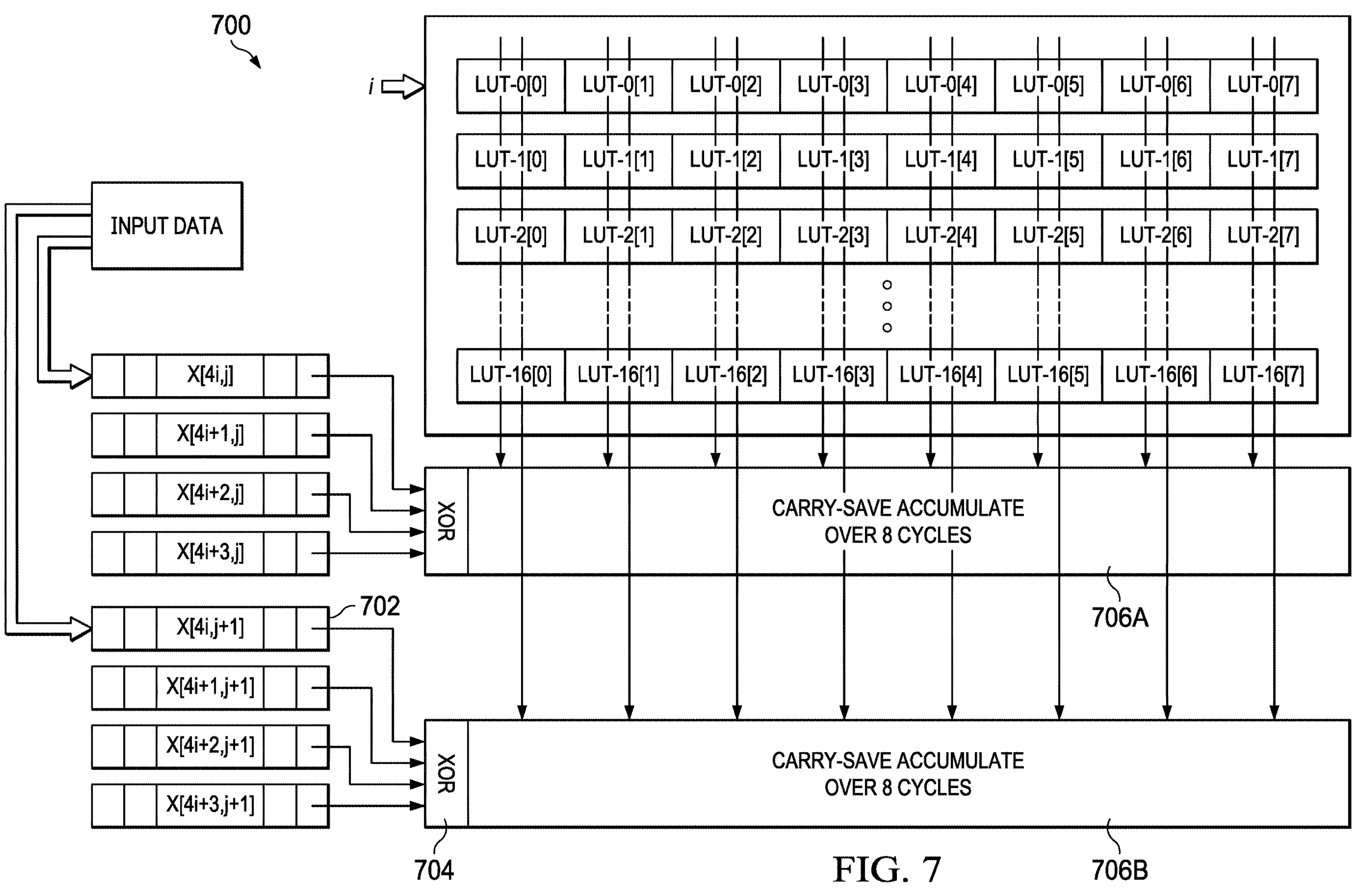
FIG. 7 illustrates an example column selection circuit including multiple accumulator circuits, in aspects of this description.

In convolutional layers of a neural network, the same convolutional kernel is applied to the entire input feature map. In aspects of this description, throughput of an ML hardware accelerator is increased by processing multiple sets of received data using the same LUT concurrently. FIG. 7 illustrates an example column selection circuit 700 including multiple accumulator circuits. Column selection circuit 700 is different from the column selection circuit 500 of FIG. 5, because column selection circuit 700 has a second read port on the SRAM, such as on the sense amplifier, and has a second set of bit shift registers 702 coupled to a chain of XOR gates 704 and accumulator circuit 706B. For example, two neighboring data of an input feature map can be accessed concurrently. The same weights may be used by the ML network for processing the two received datasets, so output from the SRAM burst for a particular LUT value may be provided to two sets of accumulator circuits 706A, 706B concurrently. The accumulator circuits 706A, 706B may then perform the appropriate bit shift and addition operations. This example illustrates processing two sets of received data concurrently, but any number of sets of received data may be processed concurrently.

As described above, ML networks may include various layers. These layers may include convolutional, depth-wise, point-wise, fully connected, etc. layers. Each type of layer may be handled slightly differently. For example, the circuits as described in conjunction with FIGS. 4-7 may fully support a convolutional or depth-wise layer. Fully connected layers have an input feature map of dimension 1*1, so reuse of the weights within a single input is reduced, as compared to a convolutional layer. However, multiple inputs (such as described in conjunction with FIG. 7) may still use the same weights. This helps fully connected layers benefit from multiple accumulator circuits as described in FIG. 7, and it accelerates operations of such layers. This can be accomplished by using the received data to populate the LUTs and using the weights to access the LUT. The LUT contents in this case are computed at run-time.

In certain cases, an ML network may include binary or ternary weights having values of +1/−1 or +1/0/−1, respectively. In such cases, it may be relatively inefficient to build a LUT based on the weights, because the core convolution in such cases primarily includes addition or subtraction functions. Instead, information in a LUT may be populated based on the received data A[K] and the weights that access the LUT. This is because the weights are defined as fixed values, instead of varying based on nodes. The received data is unknown, so the data values may be precomputed at run time and placed into the LUT based on the weights.

Figure 8:
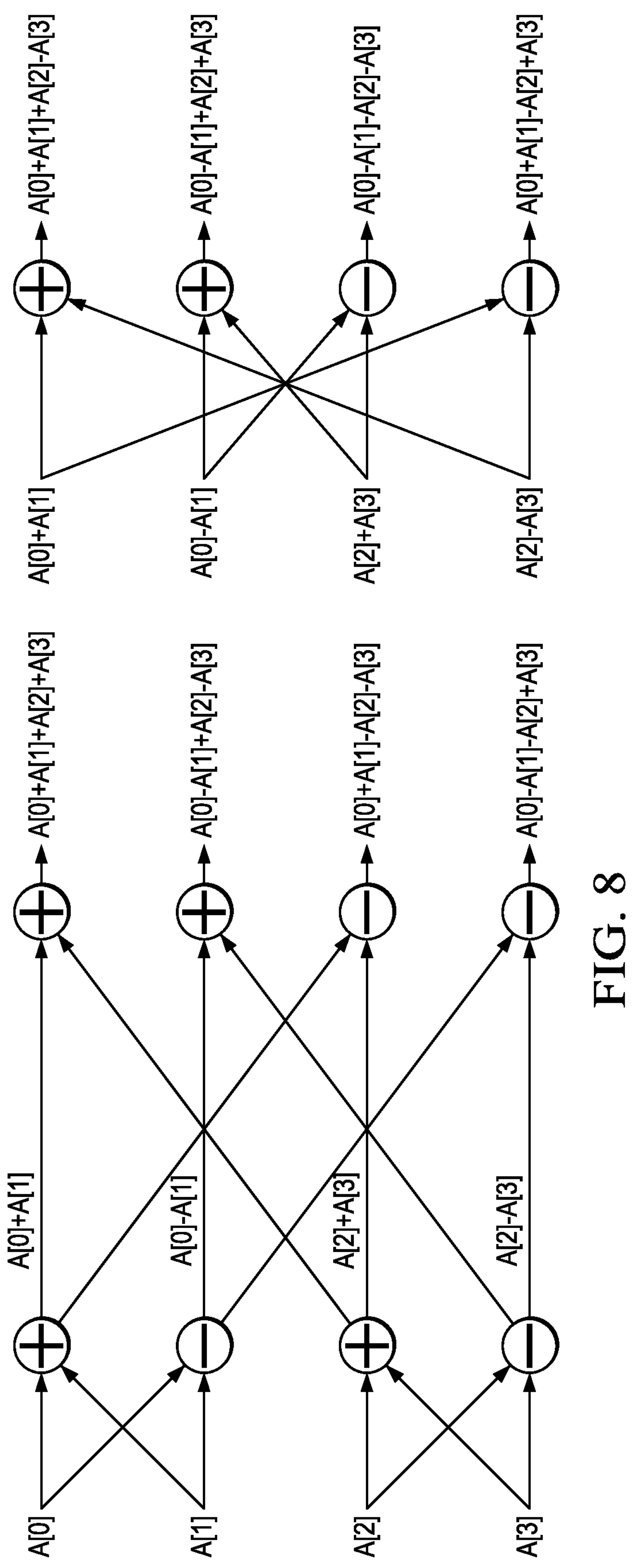
FIG. 8 illustrates a circuit for precomputing data, in aspects of this description.

FIG. 8 illustrates a circuit for precomputing data 800. Generally, contents of the LUT are based on the received data, which varies based on the input to the ML process (e.g., ML algorithm). In this example, A[k] bits of the received data may be provided to a set of 1-bit add and subtract circuits (correlating to the weights being +1/−1), in order to precompute a set of possible output values. For example, with four bits of received data, A[0] may be both added to and subtracted from A[1], and vice versa, and those results can be both added to and subtracted from results of an addition and subtraction of A[2] and A[3], and vice versa, in a single (twelve clock cycle) operation, to obtain twelve possible output values. This bitwise addition and shift process may be repeated for each set of four received bits to fill the LUT. By precomputing at least some of the possible output values, for a binary network with 8-bit received data and a 64-bit input (M) to 64-bit output (Y) with point-wise or fully connected layers, the 64*64 total additions required to process a layer may be reduced to 16*64 additions, plus the 12 additions required to precompute possible output values. In certain cases, the precomputed possible output values may populate the LUT.

Figure 9:
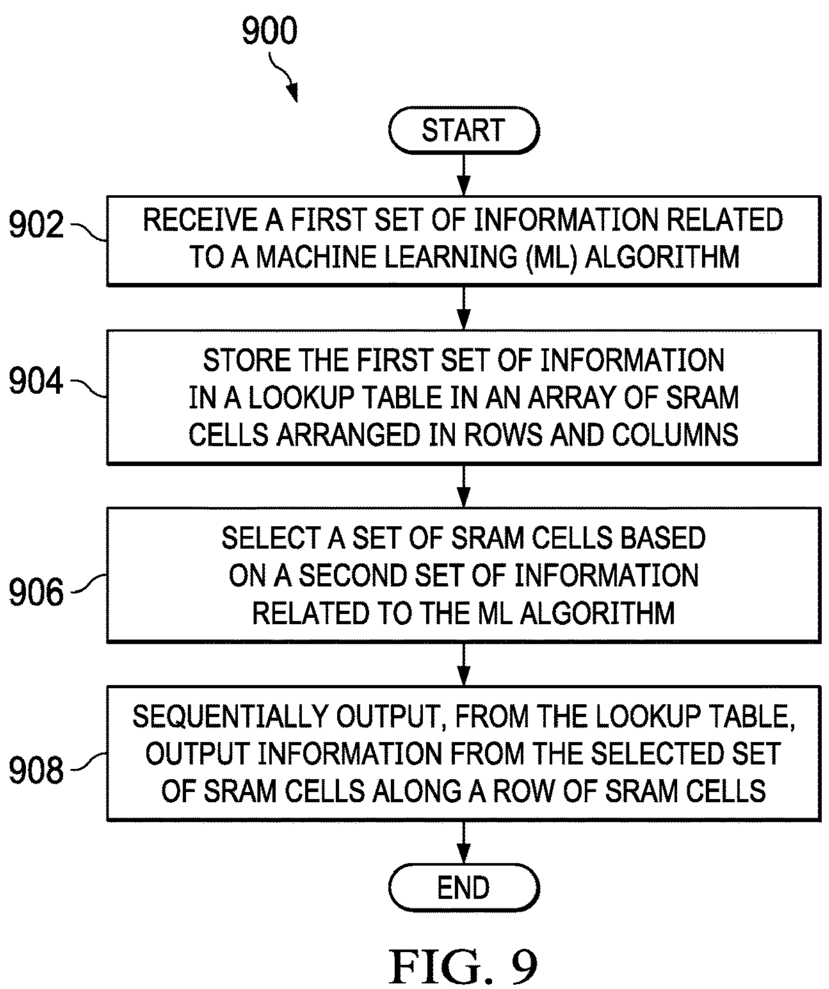
FIG. 9 illustrates a technique for increasing processing throughput of an ML process, in aspects of this description.

FIG. 9 illustrates a technique 900 for increasing processing throughput of an ML process (e.g., ML algorithm), as implemented by circuits described above. At block 902, a first set of information for the ML process is received. In a first example, weights applicable to nodes of the ML process are received. In a second example, at runtime, received data for the ML process is preprocessed to determine a set of possible output values. At block 904, the first set of information is stored in a lookup table by an array of SRAM cells, in which the SRAM cells are arranged in rows and columns. For example, the first data is written to the SRAM array, so the SRAM array includes a lookup table for the first set of information. At block 906, a set of SRAM cells is selected based on a second set of information for the ML process. In a first example, received data may be used, in a bitwise manner, to select SRAM cells of a particular row whose data will be provided. At block 908, data stored in the lookup table may be consecutively burst out from the lookup table in the SRAM array, based on the selected SRAM cells of the particular row.

Figure 10:
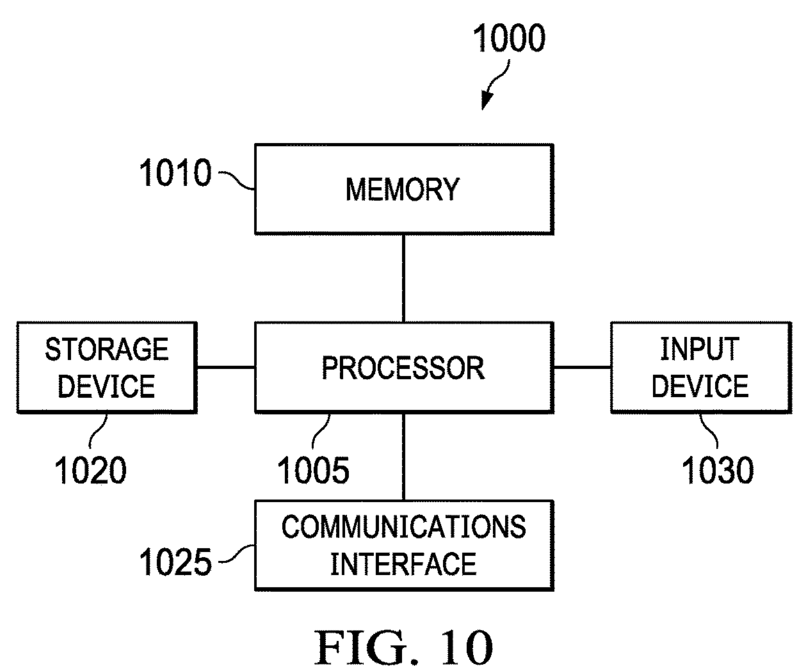
FIG. 10 is a block diagram of an embodiment of a computing device, in aspects of this description.

As illustrated in FIG. 10, a computing device 1000 includes a processing element, such as processor 1005 (e.g., microprocessor) that contains one or more hardware processors, where each hardware processor may have a single or multiple processor cores. Examples of processors include, but are not limited to a central processing unit (CPU) or a microprocessor. Although not illustrated in FIG. 10, the processing elements that form processor 1005 may also include one or more other types of hardware processing components, such as graphics processing units (GPUs), application specific integrated circuits (ASICs), field-programmable gate arrays (FPGAs), and/or digital signal processors (DSPs). In certain cases, processor 1005 may be configured to perform the tasks described in conjunction with modules 710-716, 724-730 of FIG. 7.

As shown in FIG. 10, memory 1010 may be operatively and communicatively coupled to processor 1005. Memory 1010 may be a non-transitory computer readable storage medium configured to store various types of data. For example, memory 1010 may include one or more volatile devices, such as random access memory (RAM). In certain cases, the SRAM and circuits as described in FIGS. 4-8 may be part of the memory 1010. A non-volatile storage device 1020 can include one or more disk drives, optical drives, solid-state drives (SSDs), tap drives, flash memory, electrically programmable read only memory (EEPROM), and/or any other type memory configured to maintain data for a duration of time after a power loss or shut down operation. The non-volatile storage device 1020 may also store programs that are loaded into the RAM when such programs executed.

Software programs may be developed, encoded and compiled in a variety of computing languages for a variety of software platforms and/or operating systems and subsequently loaded and executed by processor 1005. In one embodiment, the compiling process of the software program may transform program code written in a programming language to another computer language, so the processor 1005 is able to execute the programming code. For example, the compiling process of the software program may generate an executable program that provides encoded instructions (e.g., machine code instructions) for processor 1005 to accomplish specific, non-generic, particular computing functions.

After the compiling process, the encoded instructions may then be loaded as computer executable instructions or process steps to the processor 1005 from the storage device 1020, from memory 1010, and/or embedded within processor 1005 (e.g., via a cache or internal ROM). Processor 1005 may be configured to execute the stored instructions or process steps, in order to perform instructions or process steps to transform the computing device into a non-generic, particular, specially programmed machine or apparatus. Stored data (e.g., data stored by the storage device 1020) may be accessed by processor 1005 during the execution of computer executable instructions or process steps to instruct one or more components within the computing device 1000. Storage device 1020 may be partitioned or split into multiple sections that may be accessed by different software programs. For example, storage device 1020 may include a section designated for specific purposes, such as storing program instructions or data for updating software of the computing device 1000. In one embodiment, the software to be updated includes the ROM, or firmware, of the computing device. In certain cases, the computing device 1000 may include multiple operating systems. For example, the computing device 1000 may include a general-purpose operating system for normal operations. The computing device 1000 may also include another operating system, such as a bootloader, for performing specific tasks, such as upgrading and recovering the general-purpose operating system, and allowing access to the computing device 1000 at a level generally unavailable through the general-purpose operating system. Both the general-purpose operating system and another operating system may have access to the section of storage device 1020 designated for specific purposes.

The communications interface 1025 may include a radio communications interface configured to interface with one or more radio communications devices. In certain cases, elements coupled to the processor 1005 may be integrated on hardware shared with the processor 1005. For example, the communications interface 1025, storage device 1020, and memory 1010 may be integrated, along with other elements such as a digital radio, in a single integrated circuit or package, such as in a system on a chip (SOC). Computing device 1000 may also include an input (and/or output) device 1030, such as sensors, cameras, human input devices (e.g., mouse, keyboard, touchscreen), monitors, display screen, tactile or motion generators, speakers, lights, etc. Processed data, such as from the input device 1030, may be provided from the computing device 1000 via the communications interface 1025 to one or more other devices.

Modifications are possible in the described examples, and other examples are possible, within the scope of the claims.

What is claimed is:

1. A circuit, comprising:

a static random access memory (SRAM) circuit including an array of SRAM cells and configurable to store a mapping table; and a memory controller circuit coupled to the array of SRAM cells and configurable to:

receive first data;

responsive to receiving the first data, select multiple SRAM cells from the array of SRAM cells between two precharge operations of bit lines of the array of SRAM cells; and provide second data from the selected SRAM cells, in which the second data represent results of operations on the first data.

2. The circuit of claim 1, wherein:

the array of SRAM cells includes rows and columns of SRAM cells;

each row of the SRAM cells is coupled to a respective word line;

each column of the SRAM cells is coupled to a respective bit line of the bit lines; and the memory controller circuit is configurable to:

select a row of the SRAM cells responsive to the first data; and select the multiple SRAM cells of the selected row of the SRAM cells between the two precharge operations of the bit lines.

3. The circuit of claim 2, wherein a width of LUT has a number of bits, and the memory controller circuit is confgurable to access the number of memory devices between the two precharges of the bit lines.

4. The circuit of claim 1, wherein the memory controller circuit comprises:

a selection circuit configurable to provide a subset of the second data at an output of the selection circuit based on the first data; and an accumulate and shift circuit coupled to the output of the selection circuit and configurable to perform accumulate and shift operations on bits of the subset of the second data to generate third data.

5. The circuit of claim 4, wherein the selection circuit is a first selection circuit, the accumulate and shift circuit is a first accumulate and shift circuit, and the subset of the second data is a first subset of the second data, wherein the memory controller circuit further comprises:

a second selection circuit configurable to provide a second subset of the second data at an output of second the selection circuit based on the first data; and a second accumulate and shift circuit coupled to the output of the second selection circuit and configurable to perform accumulate and shift operations on bits of the second subset of the second data to generate the third data.

6. The circuit of claim 4, wherein the selection circuit includes XOR gates.

7. The circuit of claim 1, wherein the first data are based on weights of a machine learning (ML) process, and the mapping table includes a mapping between the weights and a set of candidate output data of the ML process from combining input data with the weights.

8. The circuit of claim 1, wherein the first data are based on input data to a ML process, and the mapping table includes a mapping between the input data and a set of candidate output data of the ML process from combining the input data and weights of the ML process.

9. The circuit of claim 8, further comprising an arithmetic circuit configurable to compute the set of candidate output data based on the input data.

10. The circuit of claim 1, wherein the circuit is part of a ML hardware accelerator.

11. The circuit of claim 1, wherein the memory controller circuit is configurable to generate one or more addresses from the first data, and select the multiple SRAM cells from the array of SRAM cells using the one or more addresses.

12. A system, comprising:

a processor;

a memory circuit coupled to the processor, the memory circuit including:

a static random access memory (SRAM) circuit including an array of SRAM cells and configurable to store first data for a machine learning (ML) process; and a memory controller circuit coupled to the array of SRAM cells and configurable to:

receive second data from the processor;

responsive to receiving second data, select multiple SRAM cells from the array of SRAM cells between two precharge operations of bit lines of the array of SRAM cells; and provide third data from the selected SRAM cells, in which the third data is a subset of the first data and represent results of operations on the second data.

13. The system of claim 12, wherein:

the array of SRAM cells includes rows and columns of SRAM cells;

each row of the SRAM cells is coupled to a respective word line;

each column of the SRAM cells is coupled to a respective bit line of the bit lines; and the memory controller circuit is configurable to select a row of the SRAM cells responsive to the second data, and select the multiple SRAM cells from the selected row of the SRAM cells between the two precharge operations of the bit lines.

14. The system of claim 12, wherein the memory controller circuit comprises:

a selection circuit configurable to provide a subset of the third data at an output of the selection circuit based on the second data; and an accumulate and shift circuit coupled to the output of the selection circuit and configurable to perform accumulate and shift operations on bits of the subset of the third data to generate fourth data.

15. The system of claim 14, wherein the selection circuit is a first selection circuit, the accumulate and shift circuit is a first accumulate and shift circuit, and the subset of the third data is a first subset of the third data, wherein the memory controller circuit further comprises:

a second selection circuit configurable to provide a second subset of the third data at an output of second the selection circuit based on the second data; and a second accumulate and shift circuit coupled to the output of the second selection circuit and configurable to perform accumulate and shift operations on bits of the second subset of the third data to generate the fourth data.

16. The system of claim 14, wherein the selection circuit includes XOR gates.

17. The system of claim 12, wherein the first data include a mapping table between weights of the ML process and a set of candidate outputs of the ML process from combining input data and the weights, and the third data represent a subset of the candidate outputs.

18. The system of claim 12, wherein the first data include a mapping table between input data of the ML process and set of candidate outputs of the ML process from combining the input data and weights, and the third data represent a subset of the candidate outputs.

19. The system of claim 18, further comprising a circuit configurable to compute the set of candidate outputs based on the input data, and store the mapping table in the SRAM circuit.

20. The system of claim 12, further comprising a processor coupled to the array of SRAM cells and the memory controller circuit, wherein the processor, the array of SRAM cells, and the memory controller circuit are part of an integrated circuit.

21. A method, comprising:

storing a mapping table in an array of SRAM cells;

receiving first data;

responsive to receiving the first data, selecting multiple SRAM cells from the array of SRAM cells between two precharge operations of bit lines of the array of SRAM cells; and providing second data from the selected SRAM cells, in which the second data represent results of operations on the first data.

22. The method of claim 21, further comprising:

performing a first bitwise addition and shift on second data.

23. The method of claim 21, wherein:

the array of SRAM cells are arranged in rows and columns;

each row of the SRAM cells is coupled to a respective word line;

each column of the SRAM cells is coupled to a respective bit line of the bit lines; and the method further comprises:

performing a first precharge operation of the two precharge operations on the bit lines;

selecting a row of the SRAM cells responsive to the first data;

selecting the multiple SRAM cells of the selected row of the SRAM cells; and after selecting the multiple SRAM cells, performing a second precharge operation of the two precharge operations on the bit lines.

24. The method of claim 21, wherein the first data are based on weights of a machine learning (ML) process, and the mapping table includes a mapping between the weights and a set of candidate output data of the ML process from combining input data with the weights.

25. The method of claim 21, wherein the first data are based on input data to a ML process, and the mapping table includes a mapping between the input data and a set of candidate output data of the ML process from combining the input data and weights of the ML process.

26. The method of claim 25, further comprising precomputing the set of candidate outputs based on the input data.

* * * * *